June 8, 1965 H. S. LEE ETAL 3,188,240

COPPER OXIDE INSULATION LAYER FOR THERMOELECTRIC DEVICES

Original Filed Nov. 16, 1959

INVENTORS:
H Sam Lee
Thomas Ewing Rodgers
By Willard M. Graham
Agent.

3,188,24
Patented June 8, 196

3,188,240

COPPER OXIDE INSULATION LAYER FOR THERMOELECTRIC DEVICES

H. Sam Lee, Gardena, and Thomas E. Rodgers, Burbank, Calif., assignors to Northrop Corporation, Beverly Hills, Calif., a corporation of California Continuation of application Ser. No. 853,343, Nov. 16, 1959. This application Sept. 11, 1961, Ser. No. 139,329
1 Claim. (Cl. 136—4)

This application is a continuation of our copending application, Serial No. 853,343, filed November 16, 1959, for a Thermal-Conducting Electrically-Insulating Component and Method of Fabrication, and now abandoned.

This invention pertains to thermoelectric devices and more particularly to barrier components for thermoelectric devices having good thermal and poor electrical conducting properties.

Certain types of thermoelectric devices, for example devices operating on either the Peltier or Seebeck principles, function efficiently only if the means mounting the semiconducting element thereof have favorable thermal and unfavorable electrical conducting properties. The above statement is especially true if the mounting means are to be utilized in the construction of multiple stage thermoelectric devices of the type illustrated and described herein. To the best of applicants' knowledge no truly effective mounting means for thermoelectric devices, embodying properties as outlined above, have been developed to date.

Accordingly it is an object of this invention to provide mounting means for semiconducting components utilized in thermoelectric devices and the like having good thermal and poor electrical conductivity.

Another object is to provide mounting means for semiconducting components utilized in thermoelectric devices and the like which are of unitary construction.

Another object is to provide mounting means for semiconducting components utilized in thermoelectric devices and the like which are efficient in operation, rugged in construction and economical to fabricate.

Figure 1:
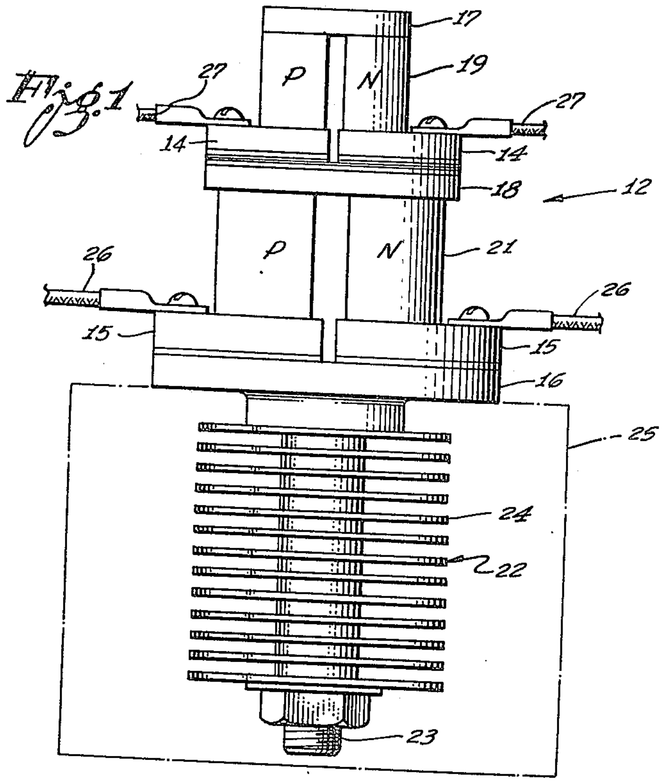
Figure 2:
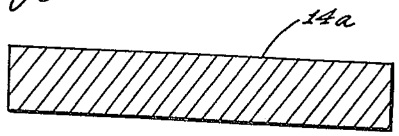

Although the characteristic features of the present invention are particularly pointed out in the appended claim, the invention itself, also the manner in which it may be carried out, will be better understood by referring to the following description taken in connection with the accompanying drawing forming a part of this application and in which:

FIGURE 1 is an elevational front view of a thermoelectric device utilizing components constructed as disclosed herein.

FIGURES 2, 3, 4, and 5 are longitudinal cross-sectional views illustrating the various steps involved in fabricating mounting means of the type disclosed herein.

Referring to the drawing, FIGURE 1 shows a thermoelectric device 12 utilizing mounting means constituting upper and lower connector members 14 and 15 constructed as disclosed herein.

The device 12 constitutes a two-stage Peltier type refrigerator utilized in installations requiring spot cooling. In the embodiment shown the device 12 includes the aforementioned connector members 14 and 15, a base plate 16, upper and lower bridge members 17 and 18, respectively, and semiconductor ingots 19 and 21. In this embodiment the major portion of components 14–18 constitute pure copper plate members while the semiconductor components of ingots 19 and 21 constitute "N" and "P" ingots constructed of bismuth telluride. It should be understood that these materials are used for purposes of illustration only and other suitable materials which are well known to those skilled in the art may be substituted therefor.

The above components are assembled in a convention manner substantially as shown in FIGURE 1. Constru tion of the device 12 is completed by a heat sink an radiation means 22. The means 22 includes a bolt men ber 23 the head of which is attached to the base plat 16 by soldering, tinning, or the like while its shank ca ries a plurality of fin members 24. Electrical power i fed into the two stages of the device 12 through the ele trical connectors 26—26 and 27—27. For purposes o illustration it may be assumed that current is caused t enter the device through the right hand connectors 2 and 27 and to exit via the left hand connectors 26 and 27 Thus the upper ends of the ingots 19 and 21, that is th ends located adjacent the bridge members 17 and 18 constitute cold ends. Accordingly the bridge member 17 and 18 constitute cold junctions and the lower end of the ingots 19 and 21 constitute hot ends.

A vacuum tube, transistor or the like (not shown) which is to be cooled is mounted in good thermal contact on the upper bridge member 17 while the means 22 is mounted in a tunnel or passageway 25 through which cooling air or other fluid is caused to circulate. Accordingly as electrical current is caused to flow through the device 12 heat is absorbed from any component mounted on the element 17 and transferred to the aforementioned cooling air via the means 22.

The connector members 14 and 15, also the lower bridge member 18, are constructed in accordance with procedures disclosed herein. Inasmuch as the methods of construction of the above members are identical, only the construction of one of the connector members 14 will be described in detail. The various steps employed in preparing a member 14 are described in detail and are illustrated in FIGURES 2–5.

A plate of pure copper 14*a* (FIGURE 2), having the same dimensions as one of the members 14 (FIGURES 1 and 5), is first thoroughly cleaned to insure the removal of grease, oxides or other organic matter therefrom. This may be accomplished by known methods using alcohol or methyl ethyl ketone. The plate is then etched with a solution of nitric acid for five (5) or ten (10) minutes. Care should be taken not to injure the major faces of the plate 14*a* since it is important that these surfaces be maintained perfectly smooth.

Figure 3:
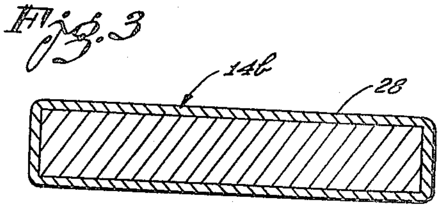
Figure 4:
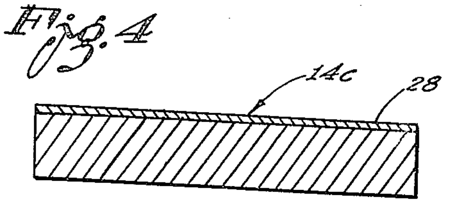

The plate 14*a* is now washed with distilled water, dried and immediately placed in an electric furnace which has been preheated for at least ten (10) minutes to a temperature of 650–980° C. After the plate 14*a* is exposed to the aforementioned temperature for ten (10) minutes a coating of copper oxide 28, the thickness of which is approximately 20–25 mils, is formed on the plate 14*a* to provide a composite plate 14*b* substantially as shown in FIGURE 3. The coating of copper oxide is subsequently removed by any suitable means from all but one of the major side faces of the plate 14*b* to provide a copper and copper oxide plate 14*c* as shown in FIGURE 4.

Figure 5:
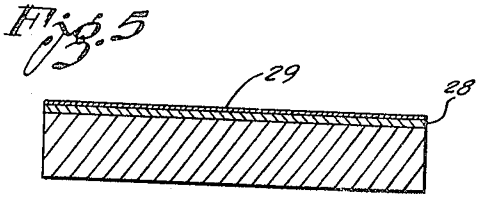

The plate 14*c* is now quenched in a reducing solution containing methyl alcohol ($CH_3OH$) and sodium borate ($Na_2O \cdot 2B_2O_3 \cdot 10H_2O$) at a temperature of 5 to 15° C. The reducing solution is prepared by admixing twenty percent (20%) methyl alcohol in five percent (5%) sodium borate solution. The reducing solution acts to change a portion of the copper oxide into pure copper to provide a coating 29 of substantially pure copper on the exposed surface of the copper oxide as shown in FIGURE 5. The reaction of the reducing solution is represented by the following formula:

$$CH_3OH + CuO \rightarrow H \cdot CHO + Cu + H_2O$$

Thus it will be seen that a thin coating 29 of pure copper is bonded by chemical action to the exposed surface : the copper oxide layer 28. Alternately a reducing solu- ɔn consisting of ethyl alcohol ($CH_3 \cdot CH_2 \cdot OH$) and ıdium borate or other well known reducing agents may ᵌ employed. Also the layer 28 of copper oxide and coat- g 29 of pure copper may be applied to the plate 14*a* / other methods, such as electroplating or vacuum coat- g operations. However, it has been found that the ɔove operations, that is utilizing oxidation and reducing ɔerations, provide chemical bonds which are much su- ɔrior in applications of the above character.

Either of the above reducing operations provides a .in film or coating 29 the thickness of which is approxi- .ately 0.3 mil. The same procedures are followed in :eparing the connector members 15 and the lower bridge .ember 18. The copper oxide layer 28 has an electrical :sistance of 900–1400 ohms per square inch at such time ; current is flowing in one direction and 2000–7000 ohms ɜr square inch when the current is flowing in the reverse :rection. Although the layer of copper oxide 28 con- itutes a good electrical insulator it does not block the ɔw of heat therethrough and in fact constitutes a good ıermal conductor.

The components 14, 15, and 18 are assembled in the ɜvice 12 substantially as shown in FIGURE 1. Spe- fically the faces of the connector members 14 and lower ridge member 18, that is the surfaces on which the coat- ıgs 28 and 29 are processed, are secured together in face › face relation. Also the members 15 are positioned n and secured to the upper surface of the base plate 16 ith the coating 29 contacting the plate 16. The elec- ical terminals 26 and 27 are directly attached to the ɔmponents 15 and 14, respectively.

In assembling the device 12 the copper coatings 29 rovide efficient means whereby the components 14 and 8 may be readily secured together as by soldering or nning, the copper coating provides the same advantage ı attaching the components 15 to the base plate 16. The ɔpper oxide layers 28, positioned between the compo- ɜnts 14 and 18 and between 15 and 16, provide good lectrical insulation and at the same time insure good ıermal conductivity therebetween. Thus it will be ap- arent that as electrical current enters the device 12 ırough the right hand connectors 26 and 27 it is caused › follow a predetermined flow path through the device 2, because of the insulating qualities of the copper oxide ıyers 28, and exit through the left hand connectors 26 ıd 27. Also the copper oxide layers 28 insure that heat, generated at the upper and lower bridge members 17 and 18, is quickly and efficiently transmitted to the radiation means 22 where it is dissipated into the aforementioned air stream. In the event the thermoelectric device 12 is a heater instead of a cooler, it is obvious that heat is transmitted equally well in the opposite direction, i.e., from radiation means 22 to upper bridge member 17 for example.

Thus it will be seen that mounting means for semi- conducting components adapted to fulfill the various objects of the invention is provided.

While in order to comply with the statute, the invention has been described in language more or less specific as to structural features, it is to be understood that the invention is not limited to the specific features shown, but that the means and construction herein disclosed comprise a preferred form of putting the invention into effect, and the invention is therefore claimed in any of its forms or modifications within the legitimate and valid scope of the appended claim.

What is claimed is:

A thermoelectric device comprising two ingots of semiconducting material forming portions of different stages thereof, two copper connector members, means respectively bonding each of said connector members to one surface of each of said ingots, a coating of copper oxide bonded on the outer face of one of said connector members, a coating of copper bonded on the outer face only of said oxide coating, and additional bonding means including a soldered joint bonding said copper coating to the other connector member, whereby a good thermal conductive and poor electrical conductive attachment is provided between said ingots.

References Cited by the Examiner

UNITED STATES PATENTS

| | | | |
|---|---|---|---|
| 1,844,925 | 2/32 | Kohler | 204—52 |
| 2,543,331 | 2/51 | Okolicsanyi | 136—4 |
| 2,844,638 | 7/58 | Lindenblad | 136—4.2 |
| 2,966,033 | 12/60 | Hughel | 62—3 |
| 2,970,449 | 2/61 | Eichhorn | 62—3 |

FOREIGN PATENTS

| | | |
|---|---|---|
| 587,490 | 4/47 | Great Britain. |
| 824,347 | 11/59 | Great Britain. |

WINSTON A. DOUGLAS, *Primary Examiner.*

JOHN H. MACK, *Examiner.*